(12) United States Patent
Yamashita et al.

(10) Patent No.: US 7,773,386 B2
(45) Date of Patent: *Aug. 10, 2010

(54) FLEXIBLE SUBSTRATE, MULTILAYER FLEXIBLE SUBSTRATE

(75) Inventors: Yoshihisa Yamashita, Kyoto (JP); Toshio Fujii, Neyagawa (JP); Seiichi Nakatani, Hirakata (JP); Takashi Ichiryu, Moriguchi (JP); Satoru Tomekawa, Yokohama (JP); Hiroki Yabe, Moriguchi (JP)

(73) Assignee: Panasonic Corporation, Osaka (JP)

( * ) Notice: Subject to any disclaimer, the term of this patent is extended or adjusted under 35 U.S.C. 154(b) by 227 days.

This patent is subject to a terminal disclaimer.

(21) Appl. No.: 11/976,848

(22) Filed: Oct. 29, 2007

(65) Prior Publication Data

US 2008/0210458 A1 Sep. 4, 2008

Related U.S. Application Data (63) Continuation of application No. 11/079,316, filed on Mar. 15, 2005, now Pat. No. 7,321,496.

(30) Foreign Application Priority Data

Mar. 19, 2004 (JP) .......................... P2004-079847

(51) Int. Cl.
*H05K 1/00* (2006.01)
(52) U.S. Cl. .................. 361/749; 361/765; 361/766; 361/794; 361/795; 174/254; 174/258
(58) Field of Classification Search ... 361/306.1–306.3, 361/749–750, 782–784, 792–795; 174/254–261
See application file for complete search history.

(56) References Cited

U.S. PATENT DOCUMENTS 4,427,840 A    1/1984   Waldrop et al.

(Continued)

FOREIGN PATENT DOCUMENTS

CN            1383705       12/2002

(Continued)

OTHER PUBLICATIONS

English computerized translation and English abstract of JP 2000-77800, which was submitted in the IDS filed on Oct. 29, 2007.

*Primary Examiner*—Tuan T Dinh
(74) *Attorney, Agent, or Firm*—Wenderoth, Lind & Ponack, L.L.P.

(57) ABSTRACT

A flexible substrate includes: (i) a film; (ii) an insulating resin layer formed on each of a front face of the film and a rear face of the film, which rear face is opposite to the front face; (iii) a front-sided wiring pattern embedded in the insulating resin layer formed on the front face of the film, and a rear-sided wiring pattern embedded in the insulating resin layer formed on the rear face of the film; and (iv) a via which is located between the front-sided wiring pattern and the rear-sided wiring pattern and serves to electrically interconnect the front-sided wiring pattern and the rear-sided wiring pattern, wherein the insulating resin layer formed on each of the front face and the rear face of the film is thicker than the film.

11 Claims, 6 Drawing Sheets

U.S. PATENT DOCUMENTS

| | | | |
|---|---|---|---|
| 4,751,146 | A | 6/1988 | Maeda et al. |
| 6,021,050 | A | 2/2000 | Ehman et al. |
| 6,045,713 | A | 4/2000 | Tamiya et al. |
| 6,197,407 | B1 | 3/2001 | Andou et al. |
| 6,395,996 | B1 | 5/2002 | Tsai et al. |
| 6,623,844 | B2 | 9/2003 | Nishimoto |
| 6,678,144 | B2 * | 1/2004 | Higashi et al. ............ 361/306.3 |
| 6,797,367 | B2 | 9/2004 | Ogawa et al. |
| 7,161,241 | B2 * | 1/2007 | Kimura ...................... 257/724 |
| 2001/0005545 | A1 | 6/2001 | Andou et al. |
| 2002/0004124 | A1 | 1/2002 | Hirasawa et al. |
| 2003/0072129 | A1 | 4/2003 | Kuwako et al. |
| 2003/0094697 | A1 | 5/2003 | Higashida et al. |
| 2003/0151471 | A1 | 8/2003 | Yamada et al. |
| 2003/0168727 | A1 | 9/2003 | Kimura |
| 2003/0180512 | A1 | 9/2003 | Andou et al. |
| 2004/0045738 | A1 | 3/2004 | Sugawa et al. |

FOREIGN PATENT DOCUMENTS

| | | |
|---|---|---|
| EP | 0 533 198 | 3/1993 |
| EP | 0 961 533 | 12/1999 |
| EP | 1 229 769 | 8/2002 |
| JP | 2-180679 | 7/1990 |
| JP | 4-107896 | 4/1992 |
| JP | 10-256700 | 9/1998 |
| JP | 11-157002 | 6/1999 |
| JP | 2000-77800 | 3/2000 |
| JP | 2000-340954 | 12/2000 |
| JP | 2001-326458 | 11/2001 |
| JP | 2003-224366 | 8/2003 |
| JP | 2004-31588 | 1/2004 |

* cited by examiner

Fig. 9

# FLEXIBLE SUBSTRATE, MULTILAYER FLEXIBLE SUBSTRATE

This application is a continuation of U.S. application Ser. No. 11/079,316, filed Mar. 15, 2005 now U.S. Pat. No. 7,321,496.

FIELD OF THE INVENTION

The present invention relates to a flexible substrate. In particular, the present invention relates to a flexible substrate and a multilayer substrate which are suitable for mounting, and also relates to a process for producing the same.

BACKGROUND OF THE INVENTION

A flexible substrate (i.e. flexible printed circuit) has a fundamental structure composed of a conductor and a heat-resisting polymer film. A flexible substrate in which the conductor is disposed only on one side of the heat-resisting polymer film is called "single-sided flexible substrate". In contrast, a flexible substrate in which conductors are disposed on both sides of the heat-resisting polymer film is called "both-sided flexible substrate".

A copper clad laminate (CCL) is generally used to produce the single-sided flexible substrate. There are two kinds of copper clad laminates, wherein one is a three-layer CCL in which a copper foil is disposed on the heat-resisting polymer film via an adhesive, and the other is a two-layer CCL in which a copper foil is disposed on the heat-resisting polymer film without an adhesive layer. Such two-layer or three-layer CCLs are respectively produced by performance of a laminating process, a casting process or a sputtering/plating process. A subtractive process is performed by using the two-layer or three-layer CCLs, and thereby the single-sided flexible substrate is consequently obtained.

A laminating process of the single-sided or both-sided flexible substrates by using a film and an insulating resin layer leads to a multilayer flexible substrate. A through-hole conductor (i.e. via) is formed in the multilayer flexible substrate by coating an inner wall of a through-hole with a metal. Therefore, wiring patterns of respective layers in the multilayer flexible substrate are electrically connected to each other.

Such flexible substrate or multilayer flexible substrate can be effectively used for a spatially narrow mounting-area due to flexibility thereof. For example, the flexible substrate or multilayer flexible substrate is mounted not only for a small space around a compact liquid crystal provided for in a camera, a cell-phone or a portable PC, but also a small space around PC peripheral equipment such as a printer or an HDD. Recently, further high density and performance of a semiconductor has been required as an electronics device is becoming more compact, lighter and thinner. Therefore, a flexible substrate having a semiconductor or a passive element is also required to be thinner and of high-density. For example, not only an increase of an output terminal number, but also a fine pad pitch of a driver IC is required with progress in terms of colorization and high definition of a liquid crystal display.

With respect to the foregoing, related documents are as follows:
Japanese Patent Kokai Publication No. 11-157002 (see 3 page thereof);
Japanese Patent Kokai Publication No. 2004-31588 (see 2 page thereof);
Japanese Patent Kokai Publication No. 4-107896 (see 1 and 2 pages thereof);
Japanese Patent Kokai Publication No. 2-180679 (see 1 page thereof);
Japanese Patent Kokai Publication No. 10-256700 (see 2 and 3 pages thereof);
Japanese Patent Kokai Publication No. 2000-77800 (see 1 page thereof);
Japanese Patent Kokai Publication No. 2003-224366.

A conventional flexible substrate and a conventional process for producing the same were fraught with problems as shown in following matters (I)-(VII):

(I) Miniaturization of a wiring pattern is important from a standpoint of producing a thinner and high-density flexible substrate. There is a limitation of fine wiring of a wiring pattern with regard to a subtractive process (i.e. chemical etching), because a thickness of a copper foil used in the flexible substrate is from 18 to 35 μm. That is to say, it is difficult for the subtractive process to produce an at most 75 μm line width of a wiring pattern by using copper foil having a thickness of 18-35 μm. As a result, a thinner copper foil is needed for attaining a further miniaturization of the wiring pattern.

(II) In a case where the subtractive process such as a chemical etching is used to produce a wiring pattern, there is a possibility that an etchant is left behind between wiring patterns, which in turn adversely affects a reliability of electrical insulation. The subtractive process provides such a construction that a wiring pattern protrudes from a surface of a substrate. This protrusion of the wiring pattern results in a decrease of a surface flatness in the substrate. Thus, there is a possibility that a bump provided in a semiconductor chip is somewhat difficult to be mounted on the wiring pattern. Also, there is a possibility that a mounted bump is moved between wiring patterns, and therefore a short-circuit occurs. Also, the protrusion of the wiring pattern itself may cause to interrupt a plastic molding process that is performed afterward.

(III) A through-hole conductor is generally used to connect wirings of respective layers to each other. This indicates that an increase in a number of the layers will lead to an increase in a number of through-hole conductors, which in turn will result in less sufficient space for the wirings. Therefore, it is a general method to laminate single-sided flexible substrates provided with through-hole conductors or both-sided flexible substrates provided with through-hole conductors. In this case, the through-holes are filled with a metal paste. Such metal paste inevitably contains a liquid resin or solvent in terms of efficient filling and printing, and thus a resulting circuit has a higher resistance than that of a conventional circuit prepared by performing a copper plating process. With a decrease in a diameter of the through-hole, the through-holes become increasingly harder to be filled with the metal paste. Thus, a viscosity and fluidity of the metal paste are required to be adjusted by adding a large amount of solvent to the metal paste. This results in an evaporation of the solvent contained in the metal paste, which in turn leads to a formation of gas cavities. As a result, resistance of the through-hole itself increases due to the gas cavities.

(IV) In a case where a through-hole conductor is formed, an adhesive layer and a film are respectively perforated by performance of laser machining. The adhesive layer is easy to be machined with a laser, while on the other hand, a thick film used in a conventional flexible substrate is difficult to be machined with a laser. Concretely, a hole obtained by laser-machining a conventional organic film is not circular in shape due to heat during this laser machining process, which in turn leads to a burr. Also, metal paste is difficult to be poured into the hole due to the fact that a diameter of an incident laser is smaller than that of an outgoing laser.

(V) A fine wiring pattern or through-hole conductor as well as a thin circuit component is important from a standpoint of producing a thinner and high-density flexible substrate. Passive elements such as an inductor, a condenser or a resistor are generally mounted on a surface of the substrate in such a manner that they protrude from the surface of the substrate. This will cause such a problem that the substrate becomes thick as a whole.

(VI) In a conventional flexible substrate, a passive or an active element is formed on an exposed surface of the substrate, so that the passive or the active element is not included within the flexible substrate. Thus, in a case where a multilayer substrate is produced by use of such flexible substrate, a multilayering process is performed against the passive or the active element formed on the exposed surface, and consequently the passive or the active element is formed between respective layers as well as between wiring patterns. Therefore, this will cause such a problem that a region for the wiring patterns becomes smaller.

A flexible substrate is needed to be folded in a smaller space. Thus, a better flexing life (or sliding flexibility) of the flexible substrate is required. Therefore, a sufficient flexing life of a two-layer CCL is required and thereby a high adhesion strength between a polyimide film and a copper foil is also required. Further, in a case of a three-layer CCL, in addition to the above adhesion strength, a high adhesion strength among a polyimide film and a copper foil, and an adhesive composition, is required.

Furthermore, a conventional wiring pattern formed by an etching process is exposed to its surroundings on surfaces of a flexible substrate. This will cause a microcrack in wiring patterns when the flexible substrate is folded, which will be far from satisfying in terms of the flexing life.

Considering the challenges or problems as described with respect to the above (I) to (VI), an object of the present invention is to provide a reliable, high density and thin flexible substrate that is better in terms of flexing life. A further object of the present invention is to provide a process for producing such flexible substrate.

SUMMARY OF THE INVENTION

In order to achieve these objects, the present invention provides a flexible substrate comprising:
(i) a film;
(ii) an insulating resin layer formed on each of a front composition; and
(d) embedding a wiring pattern into each of the insulating resin layers formed on the front face and the rear face of the film in such a manner that the wiring pattern is electrically connected to the conductive resin composition.

In the flexible substrate according to the present invention, each wiring pattern is buried in a corresponding insulating resin layer. Preferably, the wiring pattern is buried in the insulating resin layer in such a manner that a surface of the wiring pattern is on the same level as that of the insulating resin layer. As for the flexible substrate according to the present invention, the via is located between the front-sided wiring pattern and the rear-sided wiring pattern, so that no via penetrates wholly through the flexible substrate. Thus, such via is herein referred to also as an "inner via".

The flexible substrate according to the present invention is better in terms of surface flatness because the surface of the wiring pattern is on the same level as that of the insulating resin layer. As a result, an extremely precise mounting is possible when a semiconductor chip is mounted to the flexible substrate. Also, an adhesion strength between the insulating resin layer and the wiring pattern buried therein is kept in the flexible substrate. Thus, stress applied on the wiring pattern will disperse, which in turn will lead to sufficient flexibility (i.e. better flexing life) of the flexible substrate. Furthermore, the wiring pattern is embedded into the insulating resin layer by performance of a transferring technique, so that a clean surface of the substrate on which there is no residue (e.g. etchant) is obtained, which in turn will lead to a better reliability in terms of electrical isolation.

It is possible to arrange the via at an optional position upon producing the flexible substrate. This allows electric continuity at a desired position of the wiring patterns, which in turn will facilitate a wiring design. Also, due to the buried wiring pattern, a spacing between the front-sided wiring pattern and the rear-sided wiring pattern becomes small, which in turn leads to a smaller via.

In a case where a multilayer flexible substrate is produced by using the flexible substrate of the present invention, a passive or an active element is formed on the film. Thus, it is possible to mount a passive or an active element at a high density in such a manner that a length of their wiring is short. By combining a variety of passive and active elements with each other, a more high-performance electronic circuit can be included within the flexible substrate. Also, a high-density mounting of passive and active elements helps to minimize an adverse effect on the circuit, which effect is caused by a parasitic capacity between wirings as well as an inductance. In addition, a variety of passive and active elements can be arranged inside the substrate, so that an area required for surface-mounting as well as a number of components are minimized, which in turn will lead to a smaller and thinner flexible substrate.

DETAILED DESCRIPTION OF THE PREFERRED EMBODIMENTS

Hereinafter, a flexible substrate of the present invention and a process for producing the same will be concretely described.

Figure 1:
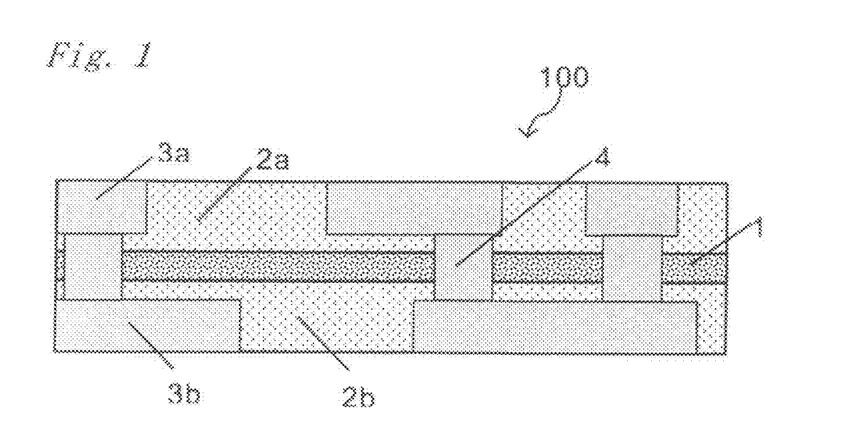
FIG. 1 shows a schematic cross-sectional view of a flexible substrate 100 according to the present invention.

FIG. 1 shows a cross-sectional view of a construction of flexible substrate 100 of the present invention. As shown in FIG. 1, insulating resin layers 2a, 2b are formed on film 1 wherein each of the insulating resin layer is thicker than the film, and wiring patterns 3a, 3b are embedded into insulating resin layers 2a, 2b. Vias are located between the wiring pattern 3a and the wiring pattern 3b. Thus, these vias serve to electrically connect wiring patterns 3a, 3b to each other.

In the flexible substrate 100 of the present invention, the insulating resin layers 2a,2b are formed in such a manner that each of them is thicker than the film 1. For example, a ratio of an insulating resin layer thickness to a film thickness (insulating resin layer thickness/film thickness) is preferably 1.1 to 8, more preferably 1.2 to 6. As used in this specification, the term "insulating resin layer thickness" means a thickness of an insulating resin layer formed on one surface of the film. Concretely, a thickness of each of the insulating resin layers 2a, 2b is, for example, 3 to 80 µm, and a thickness of the film 1 is 2 to 16 µm. In a case where each of the insulating resin layers 2a, 2b is thicker than the film 1, a flexing life or a sliding flexibility of obtained flexible substrate 100 becomes improved. A reason for this is that, when the flexible substrate is folded, stress applied on the film and buried wiring patterns is alleviated by each insulating resin layer having a low modulus of elasticity.

Further, in a case where the wiring patterns 3a,3b are embedded into the insulating resin layers 2a,2b, a thickness of each of the wiring patterns 3a,3b is preferably 40 to 100% of the thickness of each of the insulating resin layers 2a,2b, more preferably 80 to 95% of the thickness. This will lead not only to a low resistance of the via, but also to a narrow spacing between front-sided wiring pattern 3a and rear-sided wiring pattern 3b. This narrow spacing results in a smaller via.

The film 1 used in the flexible substrate 100 of the present invention generally has an insulating characteristic. Preferably, the film 1 is an organic film such as a resin film. However, the film 1 is not limited as long as it has a heat-resisting characteristic, flexibility, smoothness and a low absorptivity. For example, film 1 is made of a material selected from the group consisting polyethylene terephthalate (PET), polyphenylene sulfide (PPS), polyimide (PI), polyamide (PA), polyethylene naphthalate (PEN), polyether sulfone (PES), polyetherimide (PEI), polyarylate (PAR), polysulfone (PS), amorphous polyolefin (PO), polyamide-imide (PAI), liquid crystal polymer (LCP), modified polyphenylene ether (PPE), polybutylene terephthalate (PBT), polycarbonate (PC), and polyether ether ketone (PEEK). A film made of such material has a better heat-resisting characteristic and flexibility. Thus, by using a film made of such material, a flexible substrate suitable for folding and mounting in a spatially narrow area can be obtained, which in turn contributes to achievement of a smaller, lighter and thinner electronics device.

Among the above-mentioned materials, the polyamide is preferred in particular. A reason for this is that the polyamide has a high rigidity as well as a high heat-resisting characteristic. In particular, an aramid (i.e. aromatic polyamide) is preferred. A reason for this is that the aramid has an elastic characteristic even in a case where it is film-like, and therefore aramid is better in terms of handling ability, which in turn contributes to achievement of a thinner flexible substrate. Incidentally, from among aromatic polyamides, a para-aromatic polyamide is preferred because it is especially prominent in terms of high rigidity due to a linear structure of a main chain thereof and therefore a much thinner film can be obtained therefrom. Such thinner film is easy to be machined with a laser, thereby allowing for formation of a very small via.

Each of the insulating resin layers 2a, 2b formed on both surfaces of the film 1 serves to house each of the wiring patterns 3a, 3b. In order to improve not only an adhesion between each of the insulating resin layers 2a, 2b and each of the wiring patterns 3a, 3b, but also an adhesion between substrates when multilayered, it is preferred that each of the insulating resin layers 2a, 2b has an adhesive property. Therefore, a material for the insulating resin layers 2a, 2b is at least one resin material selected from the group consisting of an epoxy resin, a polyimide resin, an acrylic resin and a modified form thereof.

The wiring patterns 3a, 3b may be made of any material as long as this material has an electrically conductive property. For example, it is preferred that each of the wiring patterns 3a, 3b is made of a metal material selected from the group consisting of copper, nickel, gold and silver. The thickness of each of the wiring patterns 3a, 3b can be altered as its usage; however, it is preferably about 3 to 18 µm. That is, it is preferred that each of the wiring patterns 3a,3b is formed in such a manner that it is film-like. It is more preferred that the thickness of each of the wiring patterns is 3 to 12 µm in order to obtain a thinner flexible substrate having a high-density wiring.

The flexible substrate 100 of the present invention is characterized in that each of the wiring patterns 3a, 3b is embedded into each of the insulating resin layers 2a, 2b. In order to obtain such wiring patterns 3a, 3b, it is preferred that a transferring technique is performed. Concretely speaking as to a transferring technique, first, each carrier sheet on which each of wiring patterns 3a, 3b is preliminarily formed is prepared, and also a film 1 on both surfaces of which the insulating resin layers 2a, 2b are formed is prepared. It is preferred that the carrier sheet is made of an organic film (e.g. PET) or a metal foil (e.g. copper foil), and therefore the carrier sheet is a sheet-like member being about 25 to 200 µm in thickness. Subsequently, each carrier sheet is disposed on the film 1 in such a manner that each of the wiring patterns 3a, 3b formed on each carrier sheet is contacted with each of the insulating resin layers 2a, 2b, followed by pressing each of the wiring patterns 3a, 3b and each of the insulating resin layers 2a, 2b together. This causes each of the wiring patterns 3a, 3b to be embedded into each of the insulating resin layers 2a, 2b. In a case where each of the insulating resin layers 2a, 2b is made of a thermosetting resin, it is preferred that each of the insulating resin layers 2a, 2b is kept in a semi-cured state while each of the wiring patterns 3a, 3b is being embedded. Finally, by removing the carrier sheet (including no wiring pattern), a sheet member in which each of the wiring patterns 3a,3b is buried in each of the insulating resin layers 2a,2b is obtained. In this case, it is preferred that a surface of each of the wiring patterns 3a, 3b is on the same (or approximately same) level as a surface of each of the insulating resin layers 2a, 2b. That is to say, the surface of each of the wiring patterns 3a, 3b is flush with the surface of each of the insulating resin layers 2a, 2b. This results in a better surface flatness of an obtained flexible substrate, which in turn leads to an advantage for a multilayering process of substrates. This transferring technique gives a more fine-pitch wiring pattern than does a wet etching process. For example, a line/space (L/S) of a wiring pattern for a case of performing a wet etching process is 40 µm/40 µm, while a line/space (L/S) of a wiring pattern for a case of performing the transferring technique is very fine, i.e. 15 µm/15 µm (i.e. 30 µm pitch).

Each of the vias 4 is arranged between the front-sided wiring pattern 3a and the rear-sided pattern 3b in such a manner that each of the vias 4 is contacted with each of the wiring patterns 3a, 3b. Therefore, each via 4 serves to electrically connect the front-sided wiring pattern 3a and the rear-side wiring pattern 3b to each other. It is preferred that the via 4 is made of a conductive resin composition including a metal selected from the group consisting of copper, nickel and silver.

Hereinafter, preferred embodiments (I) to (V) of the flexible substrate of the present invention will be described:

According to preferred embodiment (I), at least one of a passive element and an active element, as well as a wiring connected thereto, is formed on at least one of a front face and a rear face of a film. That is to say, at least one passive element and wiring connected to the passive element are formed on at least one of the front face and the rear face of the film; at least one active element and wiring connected to the active element are formed on at least one of the front face and the rear face of the film; or at least one of a combination of a passive element and an active element, as well as wiring connected to the combination, is formed on at least one of the front face and the rear face of the film.

Figure 2:
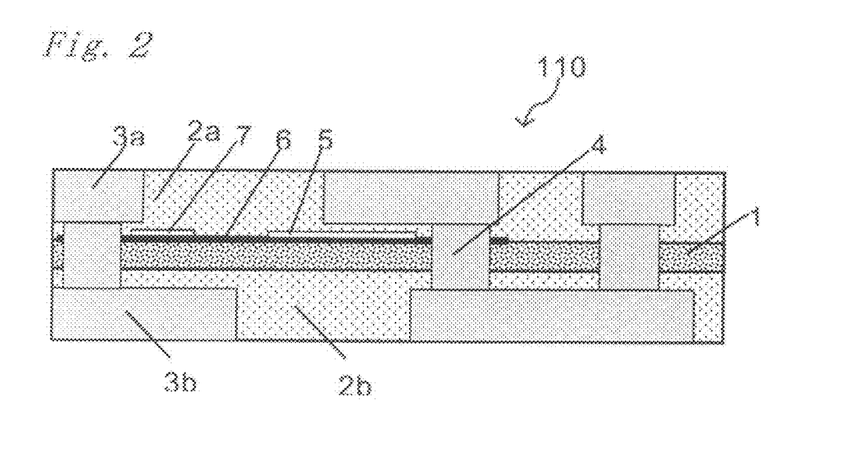
FIG. 2 shows a schematic cross-sectional view of a flexible substrate 110 including a passive element according to the present invention.

FIG. 2 shows a cross-sectional view of a construction of the flexible substrate 100 including a passive element. The same elements as those of FIG. 1 are indicated by the same numbers in FIG. 2. What is different between FIG. 1 and FIG. 2 is that a condenser 5, wiring 6 and a resistor 7 are arranged and that via 4 is also arranged to connect front-sided wiring pattern 3a, rear-sided wiring pattern 3b and the wiring 6 in FIG. 2, whereas there is no arrangement of a condenser, wiring and a resistor in FIG. 1. In the embodiment shown in FIG. 2, the condenser 5 is electrically connected to the via 4 through the wiring 6, and the resistor 7 is also connected to the via 4 through the wiring 6. Incidentally, the wiring 6 may be an electrode wiring.

In this embodiment, it is possible to arrange an electronic circuit within the substrate by combing a variety of passive and active elements. Also, it is possible to mount the passive and active elements at a high-density with a short length of their wiring. This enables to minimize an adverse effect on a circuit, which effect is caused by a parasitic capacity between wirings as well as an inductance. Further, the passive element and/or active element as well as the wiring are covered with an insulating resin layer, so that adhesion among such elements, the wiring and the film is retained. This will lead to a sufficient flexibility of the flexible substrate 100. Also, the passive element and/or active element as well as the wiring are embedded in the insulating resin layer, without being exposed to their surroundings, on a surface of the substrate, so that a flat surface of the substrate is achieved. Therefore, a lamination process (i.e. stacking process) can be performed without hindering the wiring. As a result, a high-density multilayer flexible substrate can be obtained.

According to preferred embodiment (II), the passive element and the active element are respectively formed in such a manner that they are film-like. As used in this specification, the term "film-like" means that a thickness of the passive element and/or the active element is about 0.01 μm to 70 μm. A thin passive element and/or active element will lead to achievement of a thin flexible substrate having sufficient flexibility.

According to a preferred embodiment (III), another passive element and/or active element are additionally formed.

Figure 3:
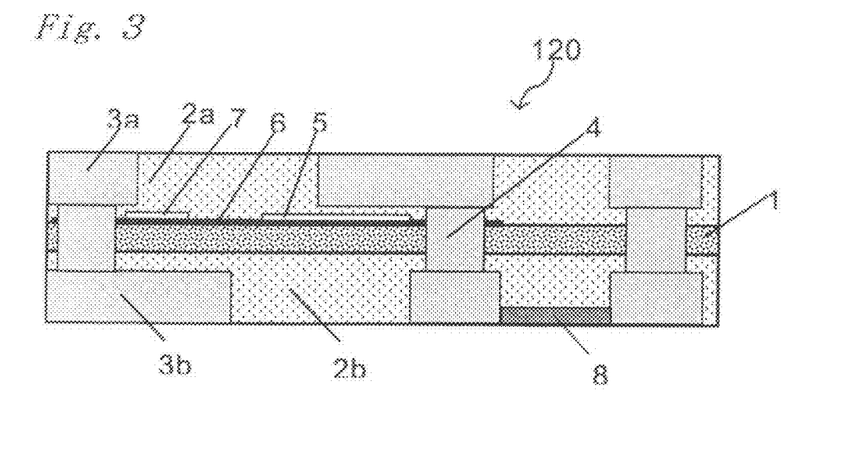
FIG. 3 shows a schematic cross-sectional view of another flexible substrate 120 according to the present invention.

FIG. 3 shows a cross-sectional view of a construction of flexible substrate 120 of the present invention wherein another passive element and/or active element are additionally formed. The same elements as those of FIG. 2 are indicated by the same numbers in FIG. 3. What is different between FIG. 2 and FIG. 3 is that resistor 8 is embedded in insulating resin layer 2b.

In this embodiment, a more high-performance electronic circuit composed of a variety of passive and active elements can be included within the flexible substrate. The passive and active elements can be mounted at a high-density with a short length of wiring. This enables to be minimized an adverse effect on a circuit, which effect is caused by a parasitic capacity between wirings as well as an inductance.

It is preferred that the passive element is a element selected from the group consisting of a condenser composed of an inorganic dielectric, a resistor, an inductor and a combination thereof.

It is preferred that the inorganic dielectric consists of ATiO3 perovskite wherein "A" of "ATiO3" is at least one element selected from the group consisting of strontium (Sr), calcium (Ca), magnesium (Mg), barium (Ba), and lead (Pb). In a case where the inorganic dielectric consists of such element, a high dielectric constant of a condenser composed of such inorganic dielectric can be obtained. As a result, an electrostatic capacity per area becomes larger, which in turn leads to a smaller flexible substrate.

It is preferred that the resistor used as the passive element is made of a material selected from the group consisting of tantalum (Ta), titanium (Ti), nickel-chromium alloy (Ni—Cr), titanium-nickel alloy (Ti—Ni), tantalum nitride (TaN), chrome-silicon oxide (Cr—SiO), Tin-doped indium oxide (ITO), zinc oxide (ZnO), copper-aluminum oxide ($CuAlO_2$), strontium-copper oxide ($SrCu_2O_2$), and aluminum-doped zinc oxide (AZO). In a case where the resistor is made of such material, a high resistance of this resulting resistor can be obtained. As a result, resistance per area becomes larger, which in turn leads to a smaller flexible substrate.

According to preferred embodiment (IV), it is preferred that the active element is an organic semiconductor. In a case where an organic semiconductor is used as an active element, a resulting flexible substrate becomes lighter and thinner. It is possible to produce the organic semiconductor by performing a simple process such as rotary press printing or inkjet printer printing, instead of by a complicated process. Therefore, this will result in a decrease of production cost.

In particular, it is preferred that the organic semiconductor is a pn junction solar cell. A reason for this is that provision of a pn junction solar cell will provide for a high-density and a more high-performance electronic circuit. As a result, a module requiring no electric power supply can be obtained, for example. Further, compared with a prior solar cell made of an inorganic substance, there are some advantages to the pn junction solar cell. The pn junction solar cell will lead to a low-cost production of a lighter and thinner flexible substrate having flexibility, because a raw material of the pn junction solar cell is less expensive, and a large facility is not required for preparing the pn junction solar cell, and moreover, the pn junction solar cell can be prepared just by applying an organic solution to the substrate.

Figure 4:
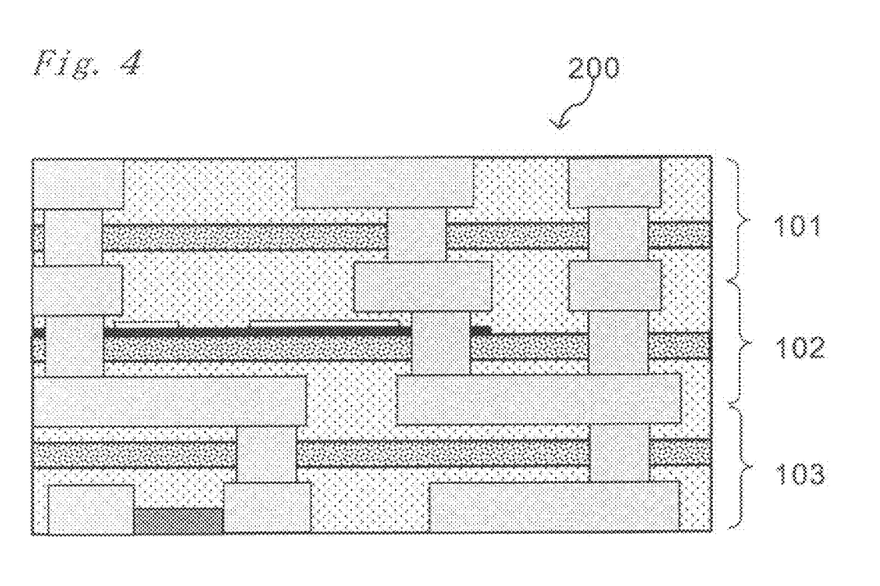
FIG. 4 shows a schematic cross-sectional view of a multilayer flexible substrate 200 according to the present invention.

Further, according to preferred embodiment (IV), a multilayer substrate is produced by stacking flexible substrates of the present invention relative to each other. FIG. 4 shows a cross-sectional view of multilayer flexible substrate 200 of the present invention. The multilayer flexible substrate 200 is composed of a first flexible substrate 101, a second flexible substrate 102 and a third flexible substrate 103. In this case, a variety of passive elements can be arranged within the multilayer flexible substrate 200, so that an area required for surface-mounting as well as a number of components is minimized, which in turn leads to a smaller electronics devise. Also, a high-density mounting of a variety of passive elements with a short length of wiring helps to minimize an adverse effect on a circuit, which effect is caused by a parasitic capacity between wirings as well as an inductance. As a result, a high-performance multilayer flexible substrate can be obtained.

Hereinafter, a process for producing a flexible substrate of the present invention will be described.

According to the present invention, a process for producing a flexible substrate composed of a film, an insulating resin layer and a wiring pattern, comprises the steps of:

(a) forming an insulating resin layer on each of a front face of the film and a rear face of the film, which rear face is opposite to the front face, with each insulating resin layer being thicker than the film;

(b) making a through hole in the film and each insulating resin layer;

(c) filling the through hole with a conductive resin composition; and (d) embedding a wiring pattern into each of the insulating resin layers formed on the front face and the rear face of the film in such a manner that the wiring pattern is electrically connected to the conductive resin composition. According to the process of the invention, it is possible to arrange a via at an optional position. This allows for electric continuity at a desired position of the wiring pattern, which will facilitate a wiring design.

In step (a), the insulating resin layers are formed on the front face of the film and the rear face opposite to the front face, wherein each of the insulating resin layers is thicker than the film. For example, an epoxy resin, a polyimide resin, an acrylic resin or a modified resin thereof is used as a material of each insulating resin layer. Therefore, such resin material is supposed to be applied or supplied to a surface of the film. It is preferred that such resin material is applied or supplied by performance of a dipping process, a roll coater process, a die coater process, a spray process or a curtain process. It is also preferred that this applied or supplied resin material is kept in a semi-cured state in spite of a drying process being performed. Accordingly, this obtained insulating resin layer is preferably subjected to a temperature of from 40 to 100° C.

Subsequently, in step (b), the film and each of the insulating resin layers are perforated for a purpose of making a through hole. A diameter of the through hole is preferably 5 to 100 μm, more preferably 10 to 50 μm. A laser, a punch or a drill may be used to make the through hole.

In step (c), the through hole is filled with a conductive resin composition. Prior to that, it is required to prepare the conductive resin composition in a paste state. Accordingly, it is preferred that this prepared conductive resin composition has a viscosity of from 10 to 300 Pa·s under a temperature of from 25 to 40° C. A screen printing process may be performed to fill the through hole with a conductive resin composition. Incidentally, the through hole does not only have to be filled with conductive resin composition; that is, through-hole plaiting may be performed to provide a metal on an inner wall of the through-hole.

In step (d), each of the wiring patterns 3a, 3b is embedded into each of the insulating resin layers 2a, 2b, and thereby each of the wiring patterns 3a, 3b is electrically connected to the conductive resin composition. Accordingly, the wiring patterns 3a, 3b are required to be located at such a position that each of the wiring patterns 3a, 3b is contacted with the conductive resin composition filled in the through-hole. In this step (c), preferably a transferring technique is employed. In this case, the wiring patterns formed preliminarily on a carrier sheet are transferred to the insulating resin layers obtained by the steps (a) to (c). In a case where the transferring technique is employed, it is possible to inspect the wiring pattern before transferring, so that only a good-quality wiring pattern can be embedded into each insulating resin layer. This will lead to a better process yield. As to the transferring technique, it is preferred that a carrier sheet is pressed toward a corresponding insulating resin layer under a condition of a temperature of 40° C. and a pressure of from 0.1 to 3 MPa. After the wiring pattern is embedded, it is preferred that a real curing of the insulating resin layer is performed under a condition of a temperature of from 100 to 200° C. and a pressure of from 0.1 to 3 MPa.

In a preferred embodiment, the process of the present invention further comprises a step of forming at least one passive element and/or active element, as well as wiring connected thereto, on at least one of the front face and the rear face of the film. In this case, the film used in step (a) is supposed to be such a film that at least one passive element and/or active element as well as wiring connected thereto is formed on at least one of the front face and rear face thereof. In step (c), the wiring pattern on the film is supposed to be electrically connected to the conductive resin composition filled in the through-hole. This connection between the wiring pattern and the conductive resin composition leads to a connection between the front-sided wiring pattern and the rear-sided wiring pattern. In this embodiment, an electronic circuit can be prepared by combining a variety of passive and active elements. Also, it is possible to mount the passive and active elements at a high-density with a short length of their wiring. This enables to be minimized an adverse effect on a circuit, which effect is caused by a parasitic capacity between wirings as well as an inductance. In the process of the present invention, at least one passive element and/or active element as well as the wiring connected thereto are covered with an insulating resin layer, and thereby a high adhesion strength among the film, the passive element, the active element and the wiring is maintained, and therefore a flexible substrate exhibiting better flexibility can be obtained.

At least one passive element and/or active element as well as wiring connected thereto may be formed by performance of a sputtering method (i.e. sputtering technique), a vacuum deposition method, or an ion plating method. In this case, even at low temperature, the passive element, the active element and the wiring can be formed from a material having a high-melting point in such a manner that they are film-like. This will lead to a better adhesion among the film, the passive element, the active element and the wiring. Therefore, the passive element, the active element and the wiring can be formed with no damage to them.

Likewise, a screen printing method (i.e. screen printing technique), a metal mask printing method, or a drawing method may also be employed. Even by performance of these methods, it is possible to form a film at a low temperature. In this case, the passive element, the active element and the wiring can be formed not only with no damage to them but also at a low cost.

In addition to transferring the wiring patterns, it is possible to transfer the passive element and/or the active element to the insulating resin layer. In this case, wiring as well as a passive element and/or an active element is preliminarily formed on a carrier, and thereafter the wiring as well as the passive element and/or the active element is embedded into each of the insulating resin layers formed on the front face and the rear face of the film.

Hereinabove, the process for producing a flexible substrate has been described. By performing such process repeatedly, a multilayer flexible substrate (see FIG. 4) can be obtained.

Figure 5:
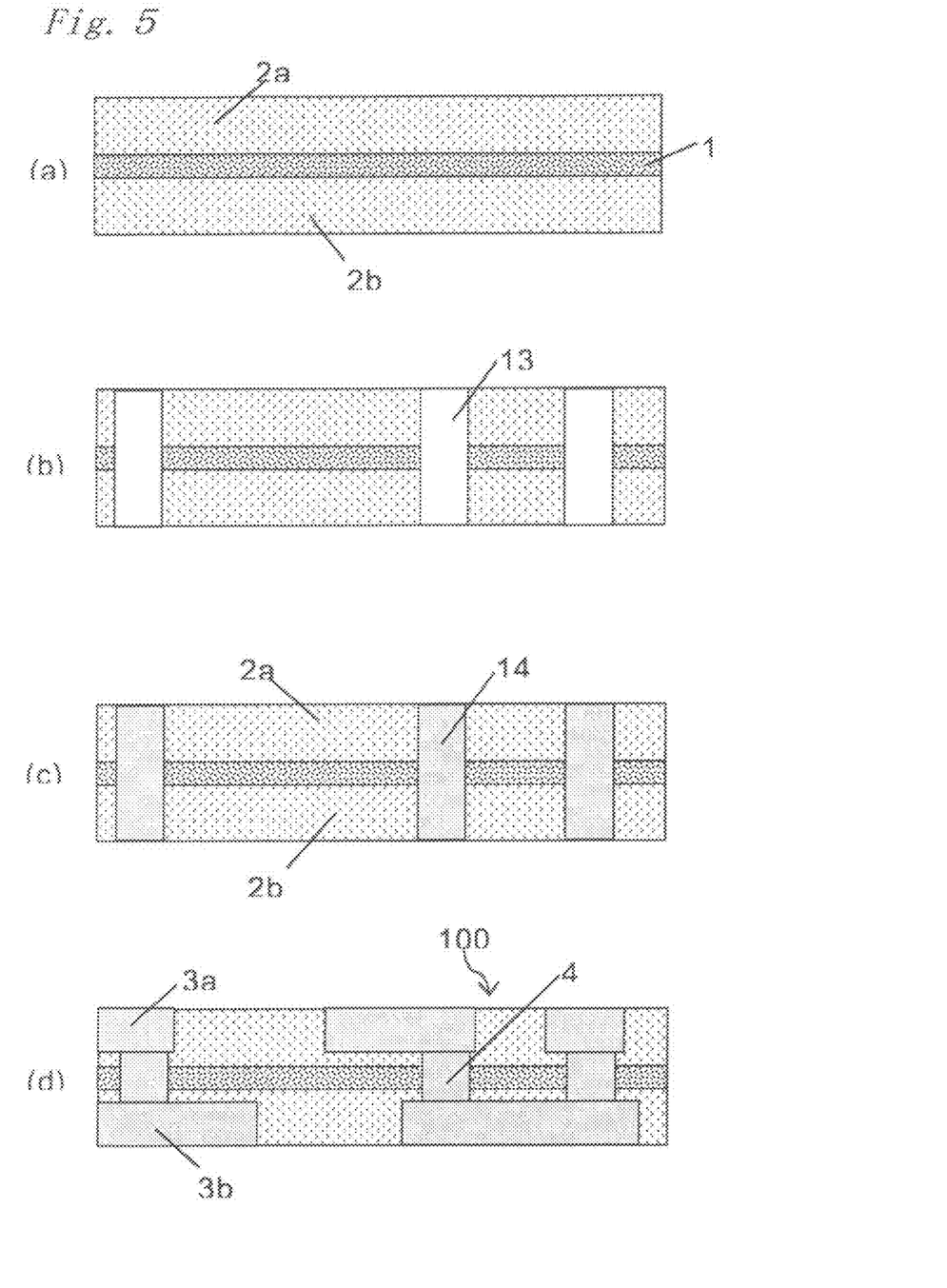
FIGS. 5(a) to 5(d) show cross-sectional views illustrating steps in a process for producing flexible substrate 100.

Turning now to FIG. 5, an example of a production process of a flexible substrate 100 according to the present invention will be hereinafter described.

First, an insulating material such as an epoxy-based thermosetting resin composition is dissolved in an aromatic solvent (e.g. toluene or xylene), a ketone-based solvent (e.g. methyl ethyl ketone or acetone), an alcohol-based solvent (e.g. methanol or ethanol), or a polar solvent (e.g. dimethylformamide or dimethylacetamide), and thereby an insulating material like a varnish is prepared. Subsequently, such insulating material is applied to both surfaces of organic film 1 made of a polyamide or a polyimide by performance of a process such as a dipping process, a roll coater process, a die coater process, a spray process or a curtain process. As a result, a sheet member in which the insulating resin layers 2a,2b are formed is obtained (see FIG. 5 (a)). Preferably, it is needed that obtained insulating resin layers 2a, 2b are kept in a semi-cured state.

Subsequently, for a purpose of making through-hole 13, the sheet member is perforated by use of a carbon dioxide gas laser or a UV laser (see FIG. 5(b)). Subsequently, the through-hole is filled with the conductive resin composition 14 (see FIG. 5(c)), followed by embedding each of wiring patterns 3a, 3b into each of the insulating resin layers 2a, 2b by performance of a transferring technique. In this case, it is preferred that a surface of each of the wiring patterns 3a,3b is on the same level as a surface of each of the insulating resin layers 2a,2b. That is to say, the surface of each of the wiring patterns 3a, 3b is flush with the surface of each of the insulating resin layers 2a, 2b. When each of the wiring patterns 3a, 3b is embedded into each of the insulating resin layers 2a, 2b, a portion of front-sided wiring pattern 3a and a portion of rear-sided wiring pattern 3b are connected to the conductive resin composition 14. This results in a formation of via 4 (see FIG. 5(d)). Finally, by performing real curing of the insulating resin layers 2a,2b, the flexible substrate 100 of the present invention can be obtained.

Figure 6:
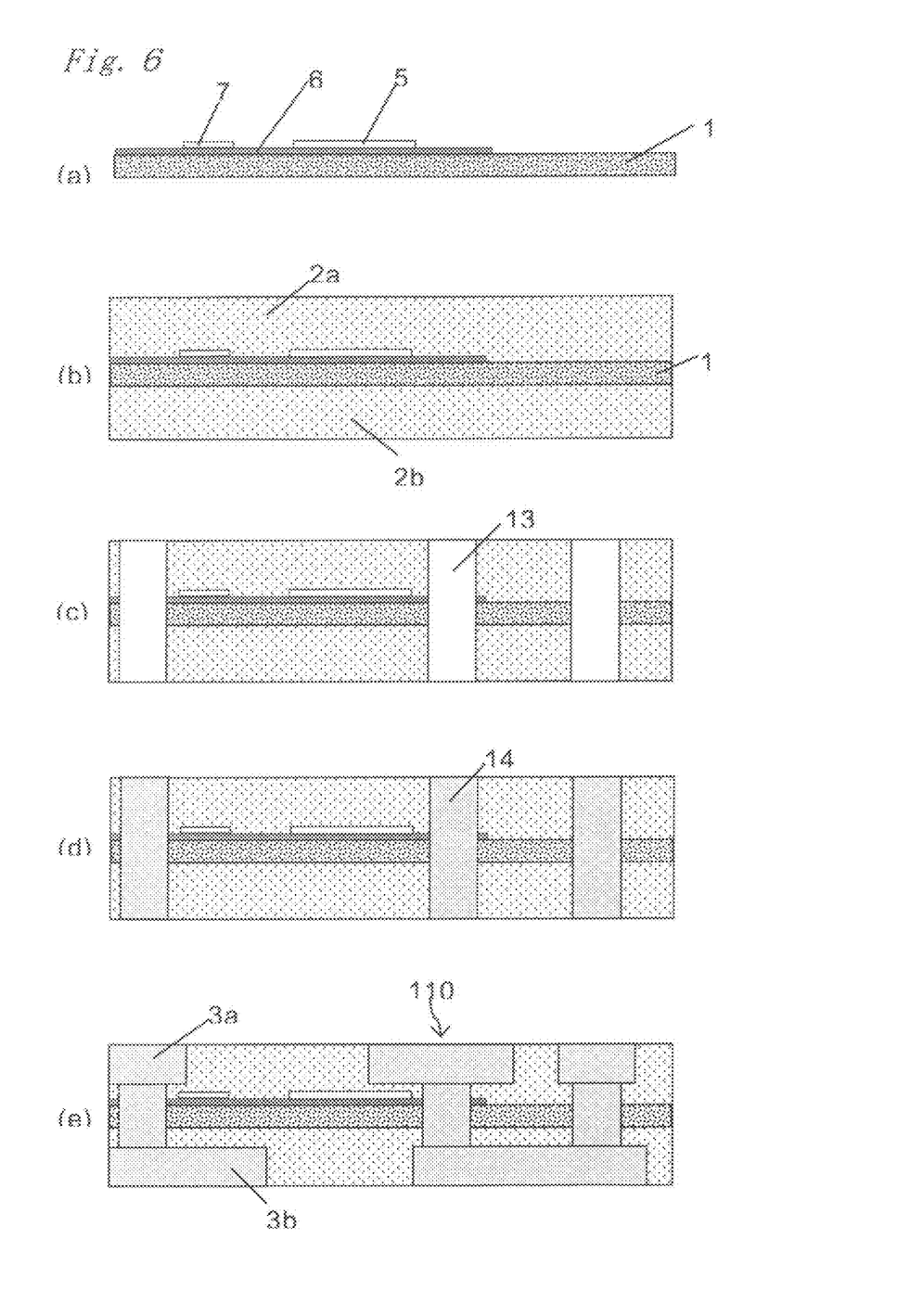
FIGS. 6(a) to 6(e) show cross-sectional views illustrating steps in a process for producing flexible substrate 110 including a passive element.

Turning now to FIG. 6, an example of a production process of a flexible substrate 110 including a passive element will be hereinafter described.

First, a condenser 5 and wiring 6 are formed on one of a front face and a rear face of organic film 1 such as an aramid film or a polyimide film (see FIG. 6(a)). The wiring 6 is formed in such a manner that a part of the wiring 6 is located at a position of a via to be formed. By performance of a sputtering method, a vacuum deposition method or an ion plating method, the condenser 5 and the wiring 6 may be formed in such a manner that they are very film-like (i.e. about 0.01 to 1 μm in film thickness). Alternatively, by performance of a screen printing method, a metal mask printing method or a drawing method, the condenser 5 and the wiring 6 may be formed in such a manner that they are less film-like (i.e. about 1 to 70 μm in film thickness).

Although the condenser 5 is formed as a passive element in the production process shown in FIG. 6, not being limited only to that, an active element may be formed on one of the front face and the rear face of the film 1. In this case, it is preferred that the active element is an organic semiconductor. It is further preferred that the organic semiconductor is a pn junction solar cell.

Subsequently, an insulating material such as an epoxy-based thermosetting resin composition is dissolved in an aromatic solvent (e.g. toluene or xylene), a ketone-based solvent (e.g. methyl ethyl ketone or acetone), an alcohol-based solvent (e.g. methanol or ethanol), or a polar solvent (e.g. dimethylformamide or dimethylacetamide), and thereby an insulating material like a varnish is obtained. Subsequently, by performance of a process such as a dipping process, a roll coater process, a die coater process, a spray process or a curtain process, the above insulating material is applied to the both surfaces of the film 1 on which the condenser 5 and wiring 6 have already been formed. As a result, a sheet member in which the insulating resin layers 2a, 2b are formed is obtained (see FIG. 6 (b)). Preferably, it is needed that obtained insulating resin layers 2a,2b are kept in a semi-cured state.

Subsequently, for a purpose of making through-hole 13, the sheet member is perforated by use of a carbon dioxide gas laser or a UV laser (see FIG. 6(c)). Subsequently, the through-hole is filled with conductive resin composition 14 (see FIG. 6(d)), and therefore this filled conductive resin composition 14 is connected to the wiring 6. After that, each of wiring patterns 3a, 3b is embedded into each of the insulating resin layers 2a, 2b by performance of a transferring technique. In this case, it is preferred that a surface of each of the wiring patterns 3a,3b is on the same level as the surface of each of the insulating resin layers 2a,2b. That is to say, the surface of each of the wiring patterns 3a, 3b is flush with the surface of each of the insulating resin layers 2a, 2b. When each of the wiring patterns 3a, 3b is embedded into each of the insulating resin layers 2a, 2b, a portion of front-sided wiring pattern 3a and a portion of rear-sided wiring pattern 3b are connected to the conductive resin composition 14. This results in a formation of via 4 (see FIG. 5(d)). Finally, by performing real curing of the insulating resin layers 2a,2b, the flexible substrate 110 including the passive element can be obtained.

Next, according to the present invention, an example of a production process of a multilayer flexible substrate will be hereinafter described.

The multilayer flexible substrate of the present invention includes the flexible substrate obtained by the above-mentioned production process as a fundamental structure. Accordingly, first, a plurality of substrates in which wiring patterns are buried in insulating resin layers is prepared by performance of the above-mentioned production process. Prepared insulating resin layers are kept in a semi-cured state so that they are not completely cured. Subsequently, a plurality of prepared substrates are stacked on each other with adjustment of position, so that a precursor of the multilayer flexible substrate is obtained. After that, the insulating resin layers of the precursor are cured as a whole by use of a roller type heat-pressure device. On this occasion, the precursor of the multilayer flexible substrate is supposed to be pressed by virtue of a clearance gap of the roller, and concurrently the insulating resin layers are supposed to be heated to be melted, followed by curing thereof. As a result, the precursor is integrated to form a multilayer flexible substrate. In this process, a reel-to-reel process or a roll-to-roll process may be employed, and thereby it is possible to produce a multilayer flexible substrate more simply than in a case where a parallel-flat board type hot-press of the prior art is employed. The reel-to-reel process or the roll-to-roll process is better in terms of producibility because these processes enable to be continuously produced a flexible substrate from a long substrate, and therefore these processes can produce a multilayer flexible substrate at low cost.

EXAMPLE

According to examples (1) to (4), experiments about a flexible substrate and a process for producing the same in accordance with the present invention were performed.

First, according to examples (1) and (2), experiments concerning a flexing life of the flexible substrate of the present invention were performed.

Example 1

Film Material

A film (organic film) used in this example is shown in Table 1.

TABLE 1

| No. | FILM | NAME OF COMMODITY (MANUFACTURER) |
|---|---|---|
| 1a | ARAMID | [MICTRON] (TORAY Co., Ltd.) |
| 1b | ARAMID | [ARAMICA] (TEIJIN ADVANCED FILM Co., Ltd.) |
| 1c | PI | [KAPTON] (DU PONT-TORAY Co., Ltd.) |
| 1d | PI | [UPILEX] (UBE INDUSTRIES Co. Ltd.) |
| 1e | PEN | [TEONEX] (TEIJIN-DU PONT FILM Co. Ltd.) | of an electroplating technique. After that, a wiring pattern was formed by superposing a dry film resist on this formed copper foil, followed by performing light exposure, development, etching, and a removal of the resist in series.

Subsequently, a supporting member having the wiring patterns was superposed on the insulating resin layers formed on a front face and a rear face of the film with adjustment of position, and therefore the wiring pattern of the supporting member were embedded into the insulating resin layers by heating to a temperature of 60° C. as well as pressing at a pressure of 3 MPa for 5 minutes. Subsequently, after cooling, only the supporting member was peeled off, followed by performing real curing of the insulating resin layers by heating them for an hour under a condition of 140° C. and 5 MPa. In this way, a substrate (i.e. sample substrate), which is regarded as a base member for the flexible substrate, was obtained. Specifications of this obtained substrate is shown in the following Table 2.

TABLE 2

| | | | THICKNESS (μm) | | | MODULUS OF ELASTICITY (GPa) | |
|---|---|---|---|---|---|---|---|
| No. | ORGANIC FILM | WIRING PATTERN | INSULATING RESIN LAYER (ON ONE SURFACE OF FILM) | FILM | SUBSTRATE | INSULATING RESIN LAYER | FILM |
| 1a | ARAMID | 12 | 15 | 12 | 42 | 0.8 | 13 |
| 1b | ARAMID | 12 | 15 | 12 | 42 | 0.8 | 15 |
| 1c | PI | 12 | 15 | 12 | 42 | 0.8 | 3.2 |
| 1d | PI | 12 | 15 | 12 | 42 | 0.8 | 8 |
| 1e | PEN | 12 | 15 | 12 | 42 | 0.8 | 6.5 |
| 1f | PET | 12 | 15 | 12 | 42 | 0.8 | 5.5 |
| 1g | PPS | 12 | 15 | 12 | 42 | 0.8 | 3.9 |
| 1h | PA | 12 | 15 | 12 | 42 | 0.8 | 1.5 |
| 1i | PC | 12 | 15 | 12 | 42 | 0.8 | 2.3 |
| 1j | PES | 12 | 15 | 12 | 42 | 0.8 | 2 |
| 1k | PEI | 12 | 15 | 12 | 42 | 0.8 | 2.8 |
| 1l | PPE | 12 | 15 | 12 | 42 | 0.8 | 1.7 |
| 1m | PEEK | 12 | 15 | 12 | 42 | 0.8 | 3.2 |

TABLE 1-continued

| No. | FILM | NAME OF COMMODITY (MANUFACTURER) |
|---|---|---|
| 1f | PET | [TETRON] (TEIJIN-DU PONT FILM Co. Ltd.) |
| 1g | PPS | [TORELINA] (TORAY Co., Ltd) |
| 1h | PA | [HARDEN] (TOYOBO Co., Ltd) |
| 1i | PC | [PANLITE] (TEIJIN CHEMICALS Co., Ltd) |
| 1j | PES | [SUMILITE FS-1300] (SUMITOMO BAKELITE Co., Ltd) |
| 1k | PEI | [SUPERIO UT] (MITSUBISHIPLASTICS, Inc.) |
| 1l | PPE | [DIANIUM] (MITSUBISHIPLASTICS, Inc.) |
| 1m | PEEK | [SUMILITE FS-1100C] (SUMITOMO BAKELITE Co., Ltd) |

(Preparation of a Substrate Used for Measuring Flexing Life)

By applying an epoxy-base thermosetting resin layer to both surfaces of the film with a roll coater process, insulating resin layers were formed. Subsequently, wiring patterns were embedded into the insulating resin layers.

Prior to embedding of the wiring patterns, a thin peel-apart layer (consisting of a nickel-phosphorus alloy) was prepared on both surfaces of an electrolytic copper foil having a thickness of 70 μm (which foil served as a supporting member of the wiring patterns), and then another copper foil (12 μm in thickness) was formed on the peel-apart layer by performance (Measurement of Flexing Life)

Based on a technique of IPC-240C and JIS-C5016, a flexing life for various types of sample substrates was measured.

Prior to this measurement, a sample substrate was fixed between two flat plates that respectively opposed each other at a certain distance in such a manner that the sample substrate was folded at 180 degrees so as to achieve a constant curvature. Subsequently, the two flat plates were moved toward each other in parallel at a predetermined speed and stroke. That is to say, the sample substrate was repeatedly slid and moved relative to the two flat plates so that a reciprocating motion thereof was performed. During this, a direct current resistance of wiring patterns located at a curved inner surface of the sample substrate was monitored. The flexing life was regarded as a cycle number of the reciprocating motion wherein the resistance was increased by 80% compared with initial resistance. By way of comparison, a flexing life of copper foil used for the wiring patterns (i.e. copper foil having a thickness of 12 μm, and which was formed by performing an electroplating technique) was also measured with a similar method to the above example.

(Result)

Figure 7:
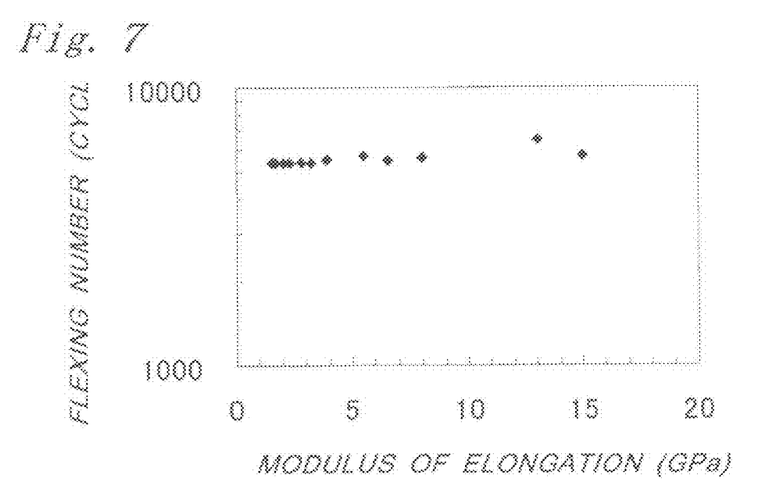
FIG. 7 is a graph that shows an elongation modulus of a film versus a flexing number.

Results of this example are shown in FIG. 7. FIG. 7 is a graph that shows a modulus of elongation of the film versus a number of flexings (flexing life) at room temperature. A comparative example showed that a rupture occurred at 800 cycles of the reciprocating motion. Considering that along with reference to FIG. 7, it is understood that the substrate, which is considered as a base member for the flexible substrate of the present invention, has a preferable flexing life irrespective of the modulus of the elongation. A reason for this is that, due to the wiring patterns buried in insulating resin layers, applied stress tends to be dispersed by the insulating resin layer that retains a corresponding wiring pattern, which in turn prevents development of a microcrack that may occur in the wiring pattern.

Example 2

Preparation of a Substrate Used for Measuring Flexing Life

In this example, by using a method similar to that of above example (1), various types of sample substrates were prepared in such a manner that a ratio of insulating resin layer thickness/film thickness is diversely changed. Specifications of a prepared substrate is shown in the following Table 3.

TABLE 3

| No. | ORGANIC FILM | WIRING PATTERN | THICKNESS (μm) | | | MODULUS OF ELASTICITY (GPa) | | INSULATING RESIN LAYER |
| | | | INSULATING RESIN LAYER (ON ONE SURFACE OF FILM) | FILM | SUBSTRATE | INSULATING RESIN LAYER | FILM | THICKNESS/ FILM THICKNESS |
| --- | --- | --- | --- | --- | --- | --- | --- | --- |
| 2a | ARAMID | 3 | 12 | 4 | 28 | 0.8 | 13 | 3.0 |
| 2b | ARAMID | 3 | 11 | 6.5 | 28.5 | 0.8 | 13 | 1.7 |
| 2c | ARAMID | 3 | 9.5 | 9 | 28 | 0.8 | 13 | 1.1 |
| 2d | ARAMID | 3 | 8 | 12 | 28 | 0.8 | 13 | 0.7 |
| 2e | ARAMID | 3 | 6 | 16 | 28 | 0.8 | 13 | 0.4 |
| 2f | ARAMID | 3 | 6 | 9 | 21 | 0.8 | 13 | 0.7 |
| 2g | ARAMID | 3 | 12 | 9 | 33 | 0.8 | 13 | 1.3 |

(Test Condition)

All of the films used in this example were an aramid film ("MICTRON" manufactured by TORAY Co., Ltd.) Sample substrates 2a to 2e were approximately the same in terms of thickness thereof, and sample substrates 2c, 2f, and 2g were the same in terms of thickness of the film. A flexing life of such sample substrates were measured by using a method similar that of above example (1). As another test condition, speed (i.e. frequency) was 25 Hz, a stroke was 25 mm, and a curvature radius was 2 mm, 4 mm and 8 mm.

(Result)

Figure 8:
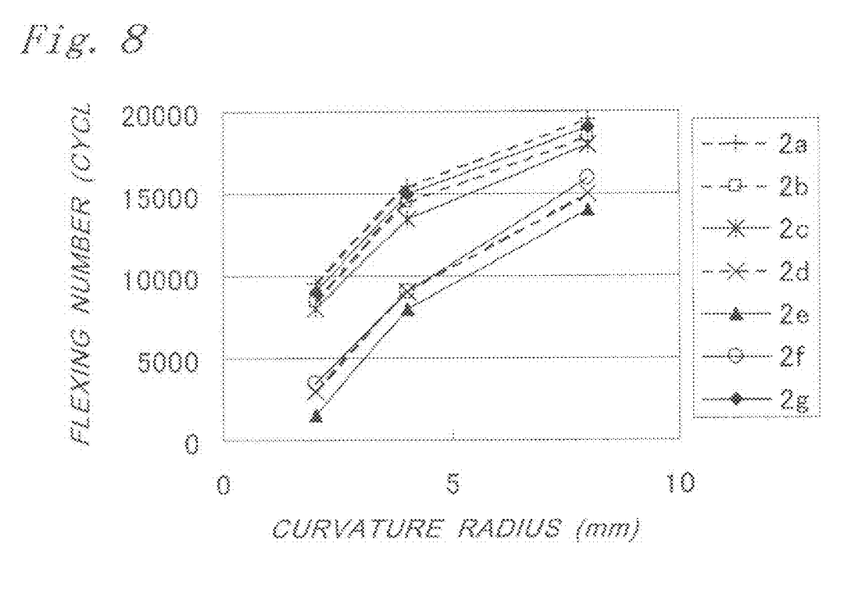
FIG. 8 is a graph that shows a curvature radius versus a flexing number.
Figure 9:
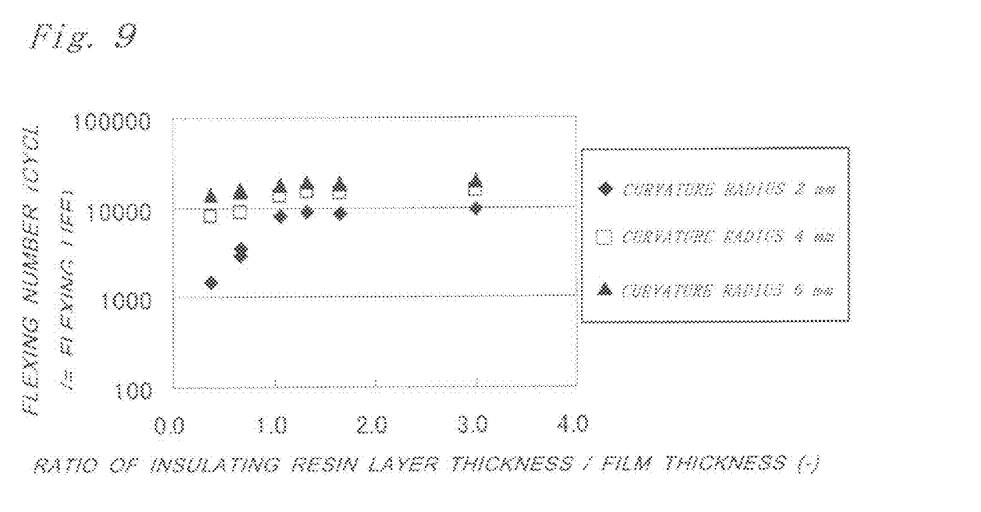
FIG. 9 is a graph that shows a ratio of an insulating resin layer thickness to a film thickness versus a flexing number.

Results of example (2) are shown in FIGS. 8 and 9. FIG. 8 is a graph that shows a curvature radius versus a flexing number (flexing life). FIG. 9 is a graph that shows a ratio of an insulating resin layer thickness to a film thickness (insulating resin layer thickness/film thickness) versus a flexing number (flexing life). With reference to these graphs, it is understood that a flexing life of the sample substrate is better in a case where the insulating resin layer is thicker than the film, and that the smaller a curvature radius becomes, the more distinctive a feature concerning the flexing life becomes. A reason for this is that stress applied to the wiring patterns and the film is supposed to be alleviated by the insulating resin layer having a low modulus of elasticity.

Next, in following examples (3) to (5), a flexible substrate and a multilayer substrate were produced by performing a production process of the present invention.

Example 3

Production of a Flexible Substrate of the Present Invention

A film used in example (3) was aramid film ("MICTRON" manufactured by TORAY Co., Ltd.) having a thickness of 4 μm. By performance of a dipping process, an epoxy-based thermosetting resin was applied to both surfaces of the film to prepare an aramid sheet with epoxy resin layers thereon. This application was performed in such a manner that a predetermined thickness of the epoxy resin layers was obtained. After that, the epoxy resin layers were dried in such a manner that they were kept in a semi-cured state. By use of a heat press, a PEN film was superposed on an upper surface of the aramid sheet (in which epoxy resin layers were formed thereon) having a thickness of 9 μm under such a condition of a temperature of 40° C. and a pressure of 0.5 MPa that did not cause the epoxy resin layer to be melted. Subsequently, by use of a UV-YAG laser, a plurality of through-holes, which were respectively 50 μm in diameter, was formed in the aramid sheet on which the epoxy resin layers were formed, followed by superposing the PEN film on one of the epoxy resin layers. Subsequently, by performance of a printing method, through-holes were filled with a conductive resin composition and then dried. In terms of a filling efficiency for a small hole, the conductive resin composition was impasted. Therefore, three rolls were used to knead a copper powder of 70 wt % (1 μm in average diameter), bisphenol A type epoxy resin of 10 wt % (serving as a resin component), amineadduct curing agent of 3 wt % (serving as a curing agent for epoxy resin) and butylcarbitolacetate of 17 wt %, based on a total weight of the conductive resin composition. As to this filling, the PEN film was used as a mask. Also, an existing screen printer was employed. That is to say, by use of a polyurethane squeegee, a conductive resin layer paste was imprinted from a surface of the substrate.

Subsequently, a wiring pattern was formed on the aramid sheet on which the epoxy resin layer was already formed. Prior to forming the wiring pattern, two complex copper foils ("PIRABLE" manufactured by FURUKAWA CIRCUIT FOIL Co., Ltd.) were prepared, wherein copper having a predetermined thickness (5 μm, 9 μm, 12 μm) was formed on one surface of the foil (70 μm in thickness) by performance of an electroplating technique. After that, the wiring pattern was formed by superposing a dry film resist on a surface of this copper plating layer, followed by performing light exposure, development, etching, and removal of the resist in series. In this case, a half-etching process may be performed in order to obtain various thicknesses of the wiring pattern.

Subsequently, the PEN film was peeled off from the aramid sheet (on which epoxy resin layers were already formed), followed by embedding the wiring pattern obtained from the copper foil into the epoxy resin layer at a pressure of 3 MPa, and then subjected to a temperature of 80° C. for 5 minutes. After cooling, the copper foil serving as a carrier sheet was peeled off. Finally, real curing of the insulating resin layers was performed by heating them for an hour under the condition of 180° C. and 5 MPa, In this way, a flexible substrate was obtained.

(Measurement of a Value of Specific Resistance of a Via)

Specific resistance of vias (i.e. inner via) formed in the flexible substrate was measured. First, by performance of a four-terminal measurement, resistance of the via was measured through the wiring pattern formed on the copper foil with a condition of five-hundred series-connected vias, followed by subtracting a resistance of the copper foil from this measured resistance. A specific resistance for the via was calculated based on a filling volume, which volume is obtained from a thickness of the substrate as well as a diameter of the hole.

Considering that a specific resistance for a metal copper particle used in the example was $1.7 \times 10^{-6}$ Ωcm, a judging standard was as follows: a specific resistance of less than 10 times that of a copper particle was considered as "excellent", while a specific resistance of more than 10 times and less than 100 times that of the copper particle was considered as "better", and a specific resistance of more than 100 times that of the copper particle was considered as "defective"

Results are shown in Table 4. According to Table 4, it was confirmed that an electrical connection concerning any via was established. In particular, in a case where a thickness of the wiring pattern was more than and equal to 80% of a thickness of the insulating resin layer (i.e. epoxy resin layer), the specific resistance of the via is less that that of the copper particle, and therefore a low resistance of the via can be obtained under that condition.

a dielectric layer by performance of a photolithography technique. Subsequently, an upper electrode was formed on the dielectric layer in the same way as a lower electrode, so that a condenser was formed on the aramid sheet. A crossover area between the upper electrode and the lower electrode was 100 μm×100 μm. Each electrode extended toward an outer side of an edge of the dielectric layer, so that vias to be formed were supposed to penetrate through the electrodes. Furthermore, by performance of a sputtering technique, a titanium layer (0.03 μm in thickness) was formed on the aramid film, followed by patterning this layer to form a resistor film (100 μm×(100 μm) by performance of a photolithography technique. After that, by performance of a sputtering technique and a plating technique, a pair of electrode wirings (consisting of copper, 20 μm in thickness) was formed on both edges of the resistor film in such a manner that the resistor film (concretely the resistor film of 100 μm wide×100 μm long) was overlaid with the electrode wiring. Each electrode wiring extended toward an outer side of the edge of the resistor film, so that vias to be formed were supposed to penetrate through the electrode wiring.

Subsequently, by performance of a dipping process, an epoxy-based thermosetting resin was applied to both surfaces of the film on which the passive element was already formed. This application was performed in such a manner that a predetermined thickness (10 μm) of the epoxy resin layers was obtained. As a result, the aramid sheet on which epoxy resin layers were formed was obtained. After that, the epoxy resin layers were dried in such a manner that they were kept in a semi-cured state. By use of a heat press, a PEN film was superposed on an upper surface of the aramid sheet having a thickness of 9 μm under such a condition of a temperature of 40° C. and a pressure of 0.5 MPa that did not allow the epoxy resin layer to be melted. Subsequently, by use of a UV-YAG laser, a plurality of through-holes, each being 50 μm in diam-

TABLE 4

| SAMPLE No. | THICKNESS OF WIRING (μm) | THICKNESS OF RESIN LAYER (μm) | RATIO OF WIRING THICKNESS TO RESIN LAYER THICKNESS (%) | SPECIFIC RESISTANCE Ω · cm | JUDGEMENT |
|---|---|---|---|---|---|
| 1 | 2 | 5 | 40 | $9 \times 10^{-5}$ | GOOD |
| 2 | 3 | 5 | 60 | $5 \times 10^{-5}$ | GOOD |
| 3 | 4 | 5 | 80 | $6 \times 10^{-6}$ | EXCELLENT |
| 4 | 5 | 5 | 100 | $5 \times 10^{-6}$ | EXCELLENT |
| 5 | 2 | 10 | 20 | $9 \times 10^{-5}$ | GOOD |
| 6 | 4 | 10 | 40 | $9 \times 10^{-5}$ | GOOD |
| 7 | 6 | 10 | 60 | $4 \times 10^{-5}$ | GOOD |
| 8 | 8 | 10 | 80 | $4 \times 10^{-6}$ | EXCELLENT |
| 9 | 10 | 10 | 100 | $4 \times 10^{-6}$ | EXCELLENT |

Example 4

Production of a Flexible Substrate Including a Passive Element

A film used in example (4) was an aramid film ("MICTRON" manufactured by TORAY Co., Ltd.) having a thickness of 4 μm. By performance of a sputtering technique, a titanium layer (0.05 μm in thickness) and a platinum layer (0.2 μm in thickness) were in turn formed on the aramid film. Subsequently, by performance of a photolithography technique, a patterning process for forming a predetermined shape was performed in order to form a lower electrode of a condenser. After that, a strontium titanate layer (0.1 μm in thickness) was formed by performance of an RF sputtering technique at 400° C. followed by patterning the layer to form eter, was formed in the aramid sheet, followed by superposing the PEN film on one of the epoxy resin layers. Subsequently, by performance of a printing method, through-holes were filled with a conductive resin composition and then dried. In terms of a filling efficiency for a small hole, the conductive resin composition was impasted. Therefore, three rolls were used to knead a copper powder of 70 wt % (1 μm in average diameter), bisphenol A type epoxy resin of 10 wt % (serving as a resin component), amineadduct curing agent of 3 wt % (serving as a curing agent for epoxy resin) and butylcarbitolacetate of 17 wt %, based on a total weight of the conductive resin composition. As to this filling, the PEN film was used as a mask. Also, an existing screen printer was employed. That is to say, by use of a polyurethane squeegee, a conductive resin paste layer was imprinted onto a surface of the substrate.

Subsequently, a wiring pattern was formed on the aramid sheet on which the epoxy resin layer was already formed and a passive element was already included. Prior to forming the wiring pattern, two complex copper foils ("PIRABLE" manufactured by FURUKAWA CIRCUIT FOIL Co., Ltd.) were prepared, wherein copper having a predetermined thickness (5 μm) was formed on one surface of the foil (thickness of which is 70 μm) by performance of an electroplating technique. After that, a wiring pattern was formed by superposing a dry film resist on a surface of this copper plating layer, followed by performing light exposure, development, etching, and removal of the resist in series.

Subsequently, the PEN film was peeled off from the aramid sheet (on which epoxy resin layers were formed), the wiring pattern obtained from the copper foil was pressed into the epoxy resin layer at a pressure of 3 MPa, and then subjected to a temperature of 80° C. for 5 minutes. After cooling, the copper foil serving as a carrier sheet was peeled off. Finally, real curing of the insulating resin layers was performed by heating these layers for an hour under a condition of 180° C. and 5 MPa, In this way, a flexible substrate including a passive element was obtained.

(Measurement of Resistance of the Passive Element)

An electric characteristic of a condenser and a resistor was measured between before and after they are included in the flexible substrate. As to the measurement of the condenser before being included, a capacity of 2.2 fF was obtained with a measuring signal of 1 kHz Likewise, as to the measurement of the resistor before being included, a resistance of 100Ω was obtained with a measuring signal of 1 kHz. As to a measurement of the condenser as well as the resistor after being embedded into an insulating resin layer (i.e. epoxy resin layer), it resulted in approximately the same findings as those before being included. Therefore, the passive elements such as a condenser and a resistor remain nearly unaffected even if they are included in the flexible substrate of the present invention.

Example 5

Production of a Multilayer Flexible Substrate of the Present Invention

In Example (5), a multilayer flexible substrate was produced by using the flexible substrate as obtained in Examples (2) or (3). First, three substrates were prepared, for each of which the wiring patterns were buried in the insulating resin layers formed on both surfaces of the film. The insulating resin layers were kept in a semi-cured state so that they were not completely cured. Subsequently, three substrates were stacked relative to each other with adjustment of a position, so that a precursor of the multilayer flexible substrate (i.e. flexible four-layer substrate) was obtained. After that, the insulating resin layers of the precursor were cured as a whole by using a roller type heat-pressure device. By adjusting a clearance gap of a pair of rollers of the heat-pressure device, a nip pressure was applied to the precursor, which pressure corresponded to 5 MPa employed in a case of a parallel-flat board type press device of the prior art. A temperature of the roller was 200° C. Upon passing through the clearance gap of a pair of rollers, the precursor was pressed as a whole, and concurrently the insulating resin layers were heated to be melted and cured. As a result of that, the precursor was integrated to produce a multilayer flexible substrate in which three flexible substrates were laminated to each other.

INDUSTRIAL APPLICABILITY

The flexible substrate and the multilayer substrate according to the present invention are better in terms of a high-density and a flexing life regardless of a thinness thereof. Therefore, they will contribute to achievement of a smaller, lighter and thinner electronics device.

CROSS REFERENCE TO RELATED PATENT APPLICATION

The present application claims the right of priority of Japanese Application No. 2004-079847 (filed Mar. 19, 2004, the title of the invention: "FLEXIBLE SUBSTRATE, FLEXIBLE MULTILAYER SUBSTRATE, AND PROCESS FOR PRODUCING THE SAME"), the disclosure of which is incorporated herein by reference.

What is claimed is:

1. A flexible substrate comprising:
   a film;
   a first insulating resin layer on a front surface of said film, and a second insulating resin layer on a rear surface of said film, with said front surface and said rear surface facing in opposite directions;
   a front-sided wiring pattern embedded in said first insulating resin layer, and a rear-sided wiring pattern embedded in said second insulating resin layer, a surface of said front-sided wiring pattern and a surface of said rear-sided wiring pattern being exposed at an outer surface of the flexible substrate, wherein said exposed surface of said front-sided wiring pattern is flush with a surface of said first insulating resin layer, and said exposed surface of said rear-sided wiring pattern is flush with a surface of said second insulating resin layer;
   a via between said front-sided wiring pattern and said rear-sided wiring pattern, said via electrically interconnecting said front-sided wiring pattern and said rear-sided wiring pattern; and
   at least one of a passive element and an active element, along with wiring connected thereto, on at least one of said front surface and said rear surface of said film, with said wiring and said via being electrically connected to each other.

2. The flexible substrate according to claim 1, wherein a ratio of a thickness of said first insulating resin layer to a thickness of said film is within a range of from 1.2 to 6, and a ratio of a thickness of said second insulating resin layer to a thickness of said film is within a range of from 1.2 to 6.

3. The flexible substrate according to claim 1, wherein a thickness of said front-sided wiring pattern is 80% to 95% of a thickness of said first insulating resin layer, and a thickness of said rear-sided wiring pattern is 80% to 95% of a thickness of said second insulating resin layer.

4. The flexible substrate according to claim 1, wherein said via comprises a conductive resin composition.

5. The flexible substrate according to claim 1, wherein at least one of said passive element and said active element is film-like.

6. The flexible substrate according to claim 1, wherein
   said passive element is selected from the group consisting of a condenser composed of an inorganic dielectric, a resistor, an inductor, and a combination thereof.

7. The flexible substrate according to claim 1, wherein said film comprises one of an aramid film and a polyimide film.

8. The flexible substrate according to claim 1, wherein resin of at least one of said first and second insulating resin layers comprises at least one resin selected from the group consisting of an epoxy resin, a polyimide resin, an acrylic resin, and a modified form thereof.

9. The flexible substrate according to claim 1, wherein said active element comprises an organic semiconductor.

10. A multilayer flexible substrate comprising:

flexible substrates laminated on one another, with at least one of said flexible substrates comprising the flexible substrate according to claim 1.

11. The flexible substrate according to claim 9, wherein said organic semiconductor comprises a pn junction solar cell.

* * * * *